United States Patent [19]

Yoshida

[11] Patent Number: 5,018,107
[45] Date of Patent: May 21, 1991

[54] SEMICONDUCTOR MEMORY DEVICE

[75] Inventor: Masanobu Yoshida, Yokohama, Japan

[73] Assignee: Fujitsu Limited, Kawasaki, Japan

[21] Appl. No.: 424,356

[22] Filed: Oct. 19, 1989

[30] Foreign Application Priority Data

Oct. 25, 1988 [JP] Japan .................................. 63-267079

[51] Int. Cl.[5] ............................................. G11C 11/409
[52] U.S. Cl. .............................. 365/230.06; 365/185;
307/449; 307/451; 307/463
[58] Field of Search ........................... 365/185, 230.06;
307/449, 463, 451

[56] References Cited

U.S. PATENT DOCUMENTS

| | | | |
|---|---|---|---|
| 4,247,921 | 1/1981 | Itoh et al. | 365/230.06 |
| 4,645,952 | 2/1987 | Van Tran | 307/451 |
| 4,649,521 | 3/1987 | Tsuchida et al. | 365/230.06 |
| 4,710,900 | 12/1987 | Higuchi | 365/230.06 |
| 4,782,247 | 11/1988 | Yoshida | 307/449 |
| 4,893,282 | 1/1990 | Wada et al. | 365/230.06 |

FOREIGN PATENT DOCUMENTS 60-61996 4/1985 Japan .................... 365/230.06
61-45496 3/1986 Japan .

*Primary Examiner*—Joseph E. Clawson, Jr.
*Attorney, Agent, or Firm*—Armstrong, Nikaido, Marmelstein, Kubovcik & Murray

[57] ABSTRACT

A semiconductor memory device has a decoder circuit. The decoder circuit includes a load transistor $T_1$, a NAND gate circuit, i.e., a driver circuit serially connected to the load transistor $T_1$ and includes a plurality of driving transistors $T_2$ to $T_5$ serially connected each other. An inverter IV is connected to the node $N_1$ formed between the load transistor $T_1$ and the NAND gate circuit. An additional load current increasing device $T_8$ is connected to the node $N_1$ or to a contact portion formed between two transistors arranged adjacently to each other in the NAND gate circuit. The load current increasing device $T_8$ is operable only in the reading mode for increasing the load current and thus to increase the threshold voltage level of the decoder circuit up to about $V_{cc}/2$, thereby preventing erroneous operation of the decoder and the memory cell array.

12 Claims, 8 Drawing Sheets

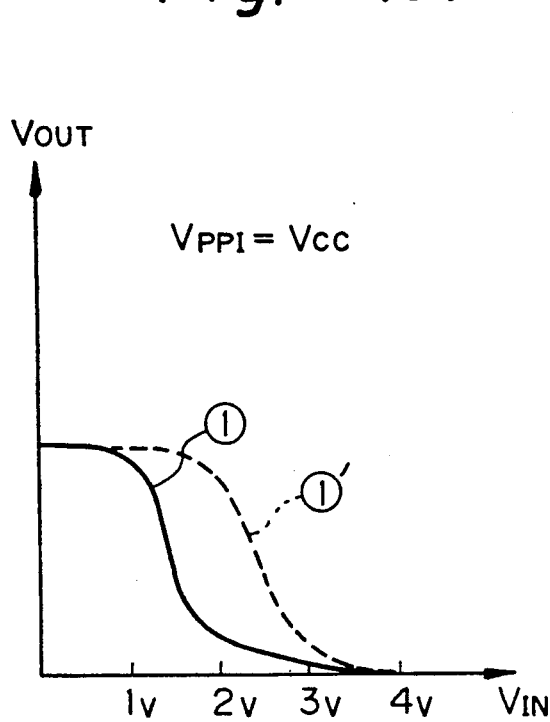
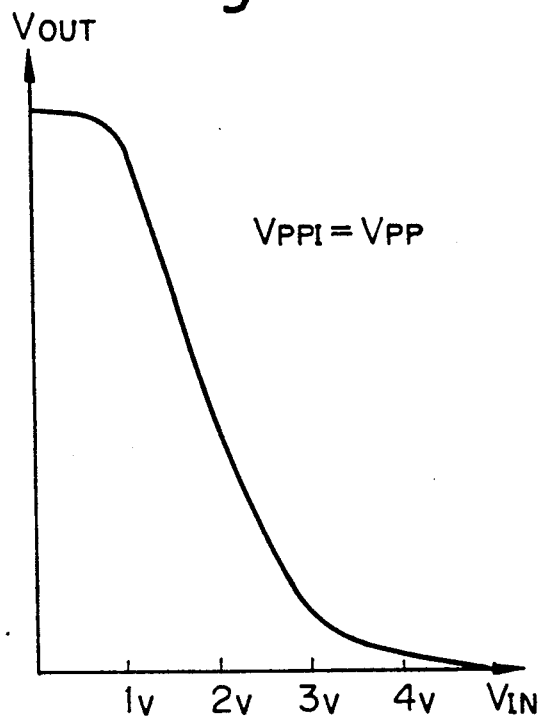
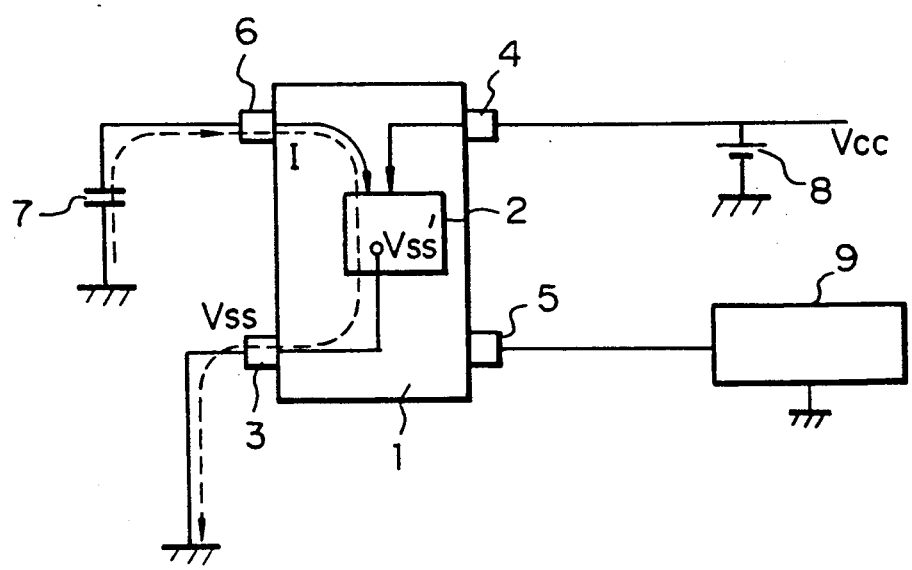

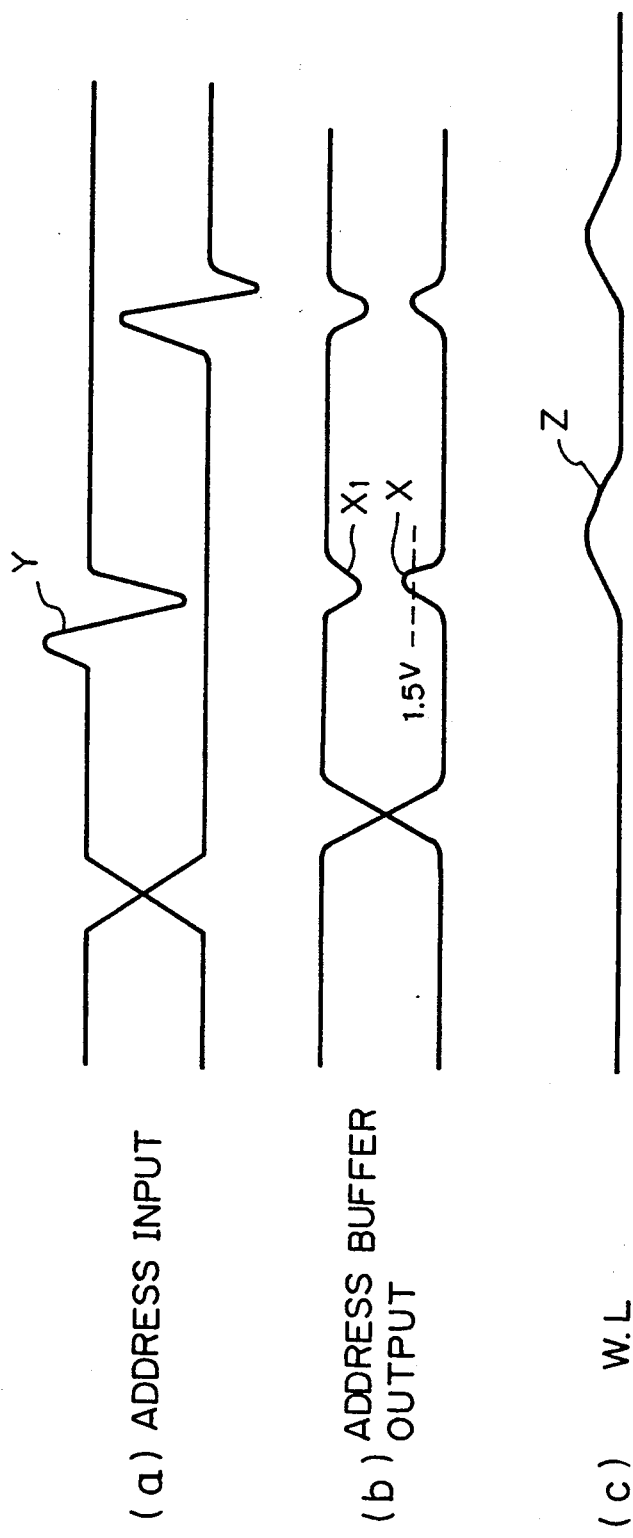

SEMICONDUCTOR MEMORY DEVICE

BACKGROUND OF THE INVENTION

1. Field of the Invention

The present invention relates to a semiconductor memory device, especially relates to an improved decoder circuit used for a semiconductor memory device including non-volatile memory cells such as an EPROM and EEPROM requiring high voltage in a writing mode (programming mode) or erasing mode.

2. Description of the Related Art

Japanese Unexamined Patent Publication (Kokai) No. 61-45496 is known as a prior art of the invention of the present application.

The circuit construction and operation of the prior art will be explained hereunder with reference to FIG. 3.

In a decoder, a source voltage $V_{PPI}$ may be switched internally to two voltage levels i.e., a low voltage of about 5 V (referred to as $V_{cc}$ hereinafter) used in a reading mode and a high voltage of about 12.5 V (referred to as $V_{PP}$ hereinafter) used in a writing mode.

The decoder is provided with an N channel depletion type MOS transistor $T_1$, N channel enhancement type MOS transistors $T_2$ to $T_5$ and $T_7$, and a P channel enhancement type MOS transistor $T_6$.

The transistors $T_1$ to $T_5$ constitute a NAND gate circuit (D).

An output $N_1$ from output terminal $N_1$ drives a CMOS inverter (IV) consisting of transistors $T_6$ and $T_7$.

An output of the CMOS inverter (IV) connects to a word line (WL).

A memory cell transistor MC is provided at each cross point of the word line (WL) and bit lines $BL_0$, $BL_1$, $BL_2$....

Input address signals a to d are applied to the gates of the driving transistors $T_2$ to $T_5$, respectively.

In a stable condition, these input address signals selectively show either the $V_{cc}$ level (logic "1") or $V_{ss}$ level (logic "0", usually showing the ground level, i.e., 0 V).

When all the voltage levels of the input address signals a to d are $V_{cc}$, the node $N_1$ (output of the decoder circuit) is reduced nearly to $V_{ss}$, i.e., 0 V, regardless of whether the decoder source voltage $V_{PPI}$ is $V_{cc}$ or $V_{PP}$.

Thus, the node $N_2$, i.e., the output voltage of the inverter is increased to $V_{PPI}$.

If one or more of the input address signals a to d is $V_{ss}$, the output $N_1$ of the decoder circuit (DEC) is increased to $V_{PPI}$.

Thus, the output of the inverter $N_2$ is reduced to $V_{ss}$, i.e., 0 V.

Here, the input address signals a to d are given from, for example, the outputs of an address buffer circuit in which the address signals applied externally thereto are subjected to a waveform shaping operation inside the chip.

A problem arises in the operation of the NAND gate circuit (D) of the decoder circuit (DEC) (as shown in FIG. 4(a)).

FIG. 4(b) shows a load curve of the decoder circuit and the output characteristic curves of the transistors $T_2$ to $T_5$.

Lines and show the load curves indicating the characteristics of the depletion type transistor $T_1$.

Line shows the load curve of the transistor $T_1$ when $V_{PPI}$ is $V_{cc}$, i.e., the reading mode, while line the load curve of the transistor $T_1$ when $V_{PPI}$ is $V_{PP}$, i.e., the writing mode.

Line on the other hand, shows the output characteristic curve of the driving transistors $T_2$ to $T_5$, wherein the input $V_{IN}$ is shown as an input to which every input to each driving transistor of the driver circuit (D) is concentrated.

Each curve shows the output characteristics curve when the input $V_{IN}$ is varied from 0 V to 5 V.

Generally speaking, in such a decoder circuit, when the decoder source ($V_{PPI}$), to which a different voltage in selectively applied, is $V_{PP}$ in the writing mode, the inverter, arranged down stream of the load means $T_1$, will frequently be erroneously operated unless the output voltage $V_{OUT}$ at the output $N_1$ of the decoder circuit (DEC) is reduced to nearly 0 V when the output $V_{OUT}$ is a low level.

Therefore, as apparent from the load curve shown in FIG. 4(b), in order to reduce the voltage of the output $V_{OUT}$ of the decoder circuit (DEC) at the node $N_1$ absolutely to $V_{ss}$, i.e., 0 V, transistors having a high driving performance, i.e., sufficiently large mutual conductance (gm), should be used for the transistors of $T_2$ to $T_5$.

The input and output characteristics curve of the decoder circuit (DEC) in the writing mode is shown in FIG. 4(d).

As seen, the output $V_{OUT}$ is $V_{PP}$ when the voltage $V_{IN}$ is below 1 V, while the output $V_{OUT}$ is reduced to nearly $V_{ss}$ when the voltage $V_{IN}$ exceeds 2.0 V preferably exceeds 2.5 V.

This means that the output $V_{OUT}$ of the decoder circuit (DEC) is reversed when the input voltage $V_{IN}$ is at around 2.5 V.

The input voltage $V_{IN}$ by which the output logic level of the NAND gate circuit of the decoder circuit (DEC) is reversed is called the threshold voltage of the NAND gate circuit.

The common sense among, persons engaged in design of the decoder circuits, is to design the input voltage (the threshold voltage of the NAND gate circuit) in the writing mode at around half of the source voltage.

Accordingly, supposing that $V_{cc}$ is set at 5 V, in order to give the input-output characteristics as shown in FIG. 4(d), to the decoder circuit (DEC), it is suitable to design the input voltage of the circuit (the threshold voltage of the NAND gate circuit) as $V_{cc}/2$, i e., at around 2.5 V.

However, in the reading mode, in which the $V_{PPI}$ is $V_{cc}$, the transistor $T_1$ may not have as high performance as indicated by the load curve in FIG. 4(b).

Therefore, as shown by the input-output characteristics curve in FIG. 4(c), when the input voltage $V_{IN}$ is less than 1 V, the output voltage $V_{OUT}$ becomes $V_{cc}$, while when the input voltage $V_{IN}$ exceeds 1.5 V, the output voltage $V_{OUT}$ becomes $V_{ss}$, to make the threshold voltage thereof remarkably lower to 1.0 to 1.5 V.

This means that, when noise is added to an input signal, especially to an input signal having 0 V, this decoder circuit (DEC) may operate erroneously.

Thus, this circuit is weak against noise.

Note that, since the threshold voltage is low in the writing mode, the problem arises that when an output of an address buffer is increased by about 1.5 V from $V_{ss}$ due to noise, the output $N_2$ of the inverter is turned to $V_{cc}$ due to the input $N_1$ of the inverter being reduced to around 0 V, instead of the output $N_2$ being naturally at $V_{ss}$.

In a non-volatile semiconductor memory device such as an EPROM, after a writing operation is carried out, only a reading operation may be carried out until an erasing operation is effected, although erroneous operations easily occur in the reading mode because the threshold voltage level of the NAND gate circuit is extremely low.

Generally speaking, in a semiconductor device, for example, a buffer circuit, the internal ground potential in a chip will be varied due to the variation of the output thereof, so a differential potential will be created between the internal ground potential and an external ground potential in the chip.

Thus, when an address signal having an external ground potential as a reference potential is applied to a chip, the intended potential level of the address signal will be varied when the potential thereof is discriminated with reference to the internal ground potential of the chip.

Therefore, an abnormal situation used to frequently occur, in which the output voltage of the buffer circuit was increased from $V_{ss}$ instead of being naturally or the output voltage thereof was decreased from $V_{cc}$ instead of being naturally $V_{cc}$.

One example of this problem will be explained in detail with reference to FIG. 5.

As shown in FIG. 5, an IC package 1 is provided with an IC chip 2, a $V_{cc}$ terminal 4, a $V_{ss}$ terminal 3, an input terminal 5, and an output terminal 6.

A load capacitance 7 is connected to the output terminal 6 of the package 1.

An electric source 8 providing a voltage of $V_{cc}$ and a signal source 9 connected to the input terminal 5 are also provided.

When the output voltage is switched from 5 V to 0 V, a discharge current from the load capacity 7 flows into the external ground terminal 3, which has a level of $V_{ss}$, through wires and transistors provided in the chip and further a chip ground, i.e., the internal ground potential, having a level of $V_{ss}'$, although in this situation, the level of the $V_{ss}'$ in the chip 2 will increase due to an inductance element inside the chip.

Thus, the level of $V_{ss}'$ in the chip 2 is sometimes instantly increased by a certain amount of voltage, for example, 2 V, instead of the level of $V_{ss}'$ being naturally at 0 V.

On the other hand, assume the package is designed so that the input voltage from the signal source 9 is set at 3 V, the chip can discriminate the input signal as the "H" level when the input signal has a voltage exceeding 2 V, and the chip can discriminate it as the "L" level when the input signal has a voltage below 1 V.

In a package as explained above, when signal having a voltage of 3 V, is input, it will be discriminated as the "H" level in a normal condition.

However, when the level of $V_{ss}'$ of the chip 2 is increased at 2 V even instantly as mentioned above, the signal input into the chip 2 will be discriminated as an input signal of 1 V.

Accordingly, it is ideal for the input characteristic of the decoder circuit that the threshold voltage be set at around $V_{cc}/2$, i.e., at around 2.5 V, so that the decoder circuit can have a sufficient noise immunity even for an increment of the input voltage from $V_{ss}$ or decrement thereof from $V_{cc}$ due to noise applied thereto.

In a semiconductor memory device having a conventional decoder circuit as mentioned above, when the decoder erroneously operates, erroneous information is transferred to a memory cell array and finally a mistaken determination is made from the memory.

The reason for them will be explained with reference to FIGS. 6 to 9.

Generally speaking, as shown in FIG. 6, address signal inputs externally provided are applied to the input terminal of a buffer circuit with a waveform as shown in FIG. 6(a), are subjected to a waveform shaping operation, and are output to the input terminals of the decoder circuit with a waveform as shown in FIG. 6(b).

In this situation, suppose that when a noise Y is added to the address signal as shown in FIG. 6(a), the output signal of the address buffer inherently has the abnormal signal portion X and X' in response to the noise portion Y as shown in FIG. 6(b).

When the output signal of the address buffer including such an abnormal signal portion X is input to the decoder circuit, the decoder will erroneously operate depending upon the level of the abnormal signal portion and the level of the threshold set for the decoder circuit.

If the level of the abnormal signal portion is higher or lower than the threshold level set for the decoder circuit, the decoder circuit will erroneously operate and output an erroneous signal information Z to the word line WL as shown in FIG. 6(c).

More specifically, when the decoder circuit is set that, as shown in FIG. 7, the outputs of the address buffer having the "H" level are applied to the gates a, b, and c and the output having the "L" level is applied to the gate d of the decoder circuit (DEC), the input threshold voltage is set at 1.5 V.

Accordingly, in this situation, the output $V_{OUT}$ at the node $N_1$ of the decoder circuit is at the "H" level and thus the output at the node $N_2$ of the inverter is at the "L" level, as shown in FIG. 7.

Suppose that when an abnormal signal portion X having a level exceeding 1.5 V is instantly applied to the input terminal d, the level of the output $V_{OUT}$ of the decoder circuit is instantly switched to the "L" level instead of being the "H" level naturally, whereby the level of the output of the inverter is also instantly switched to the "H" level instead of being the "L" level naturally.

Therefore, in this situation, the word line WL connected to this decoder is a non-selected word line and thereby the signal level thereof inherently is "L", although the level of the word line will be increased from the level of 0 V to form an abnormal signal portion z as shown in FIG. 6(c) so as to mistakenly read or write information from or into a certain memory cell.

When the duration of such an abnormal signal portion is remarkably short, such a signal does not affect the circuit arranged downstream of the circuit concerned so much, although, when the duration is relatively long, it can affect it.

In a memory cell array used in a semiconductor memory device, a plurality of pairs of a resister and capacitor are serially arranged and an equivalent circuit thereof can be represented in a figure shown in FIG. 8.

The signal output from the inverter, including an abnormal signal level, will be delayed and the duration of the abnormal signal portion will be prolonged due to the plurality of time constants caused by CR.

When such a prolonged signal portion P is output to the sense amplifier, the erroneous data portion P will be read with a threshold level $V_L$ for a period t, as shown in FIG. 9.

Note that, when such erroneous information is created due to noise in the signals, it cannot easily be corrected in the successive circuit arranged downstream of the circuit where the erroneous operation took place.

To avoid such erroneous operation of not only the decoder circuit but also the semiconductor memory device, it has been proposed to construct an address buffer circuit so as not to respond to noise so sharply, but it is very difficult to prevent such problems completely by such a method.

SUMMARY OF THE INVENTION

The object of the present invention is to eliminate the drawback of the conventional decoder circuit of poor noise immunity due to the driving transistors constituting the NAND gate circuit being set so that the decoder circuit can operate accurately in the writing mode but the threshold voltage level being reduced in the reading mode.

A further object is to provide a decoder circuit which can operate accurately in both the writing mode and reading mode even with noise by increasing the threshold voltage level in the reading mode.

To attain the objects of the present invention, there is provided a semiconductor memory device comprising a first power source line for supplying a first power source voltage during a reading mode and a second power source voltage, which is higher than the first power source voltage, during a writing mode, a second power source line for supplying a third power source voltage which is lower than the first power source voltage, a decoder circuit including a load element connected between the first power source line and an output node, and a plurality of transistors, connected in series between the output node and the second power source line, for decoding an address information and a device, connected to the decoder circuit, for increasing the load current flowing through the decoder circuit during the reading mode.

In the semiconductor memory device of the present invention, a first power source line is a line connected to a decoder source voltage ($V_{PPI}$) and a second power source line is a line connected to a lower voltage source than the decoder voltage source ($V_{PPI}$) and it may be the ground level. While a first power source voltage is, for example, $V_{cc}$ and a second power source voltage is, for example, $V_{PP}$ and further a third power source voltage is, for example $V_{ss}$.

More specifically, as shown in FIG. 1, the semiconductor memory circuit of the present invention comprises a decoder, including a decoder circuit (DEC) and an inverter (IV), and a memory cell array. The decoder circuit (DEC) is provided with a decoder source voltage ($V_{PPI}$) which is a first power source voltage ($V_{cc}$) in a reading mode and a second power source voltage ($V_{PP}$) in a writing mode. The decoder circuit further includes a load ($T_1$) and a NAND gate circuit (D) serially connected to the load ($T_1$) and provided with a plurality of driving transistors ($T_2$ to $T_5$) serially arranged therein. A device ($T_8$), i.e., a load current increasing device, for increasing the load current operating only in the reading mode for increasing the load current, is provided in the decoder circuit so as to bring the load current in the reading mode close to that in the writing mode.

BRIEF DESCRIPTION OF THE DRAWINGS

FIG. 4($b$) is a graph of the load curve of the load transistor $T_1$ in the decoder circuit shown in FIG. 4($a$) and an output characteristic curve of the NAND gate circuit consisting of the driving transistors $T_2$ to $T_5$ shown in FIG. 4($a$); FIG. 4($c$) is a graph of the output-input characteristic curve of the decoder circuit in the reading mode;

FIG. 4($d$) is a graph of the output-input characteristic curve of the decoder circuit in the writing mode;

FIG. 5 is a block diagram explaining the reason why erroneous operation occurs in a package;

FIGS. 6($a$), 6($b$) and 6($c$) are waveforms of an address signal input to an address buffer, an output signal from the address buffer, and a voltage level of a word line in a conventional semiconductor memory device;

DESCRIPTION OF THE PREFERRED EMBODIMENTS

The preferred embodiments of the present invention will be explained in detail hereunder with reference to the attached drawings.

Figure 10:
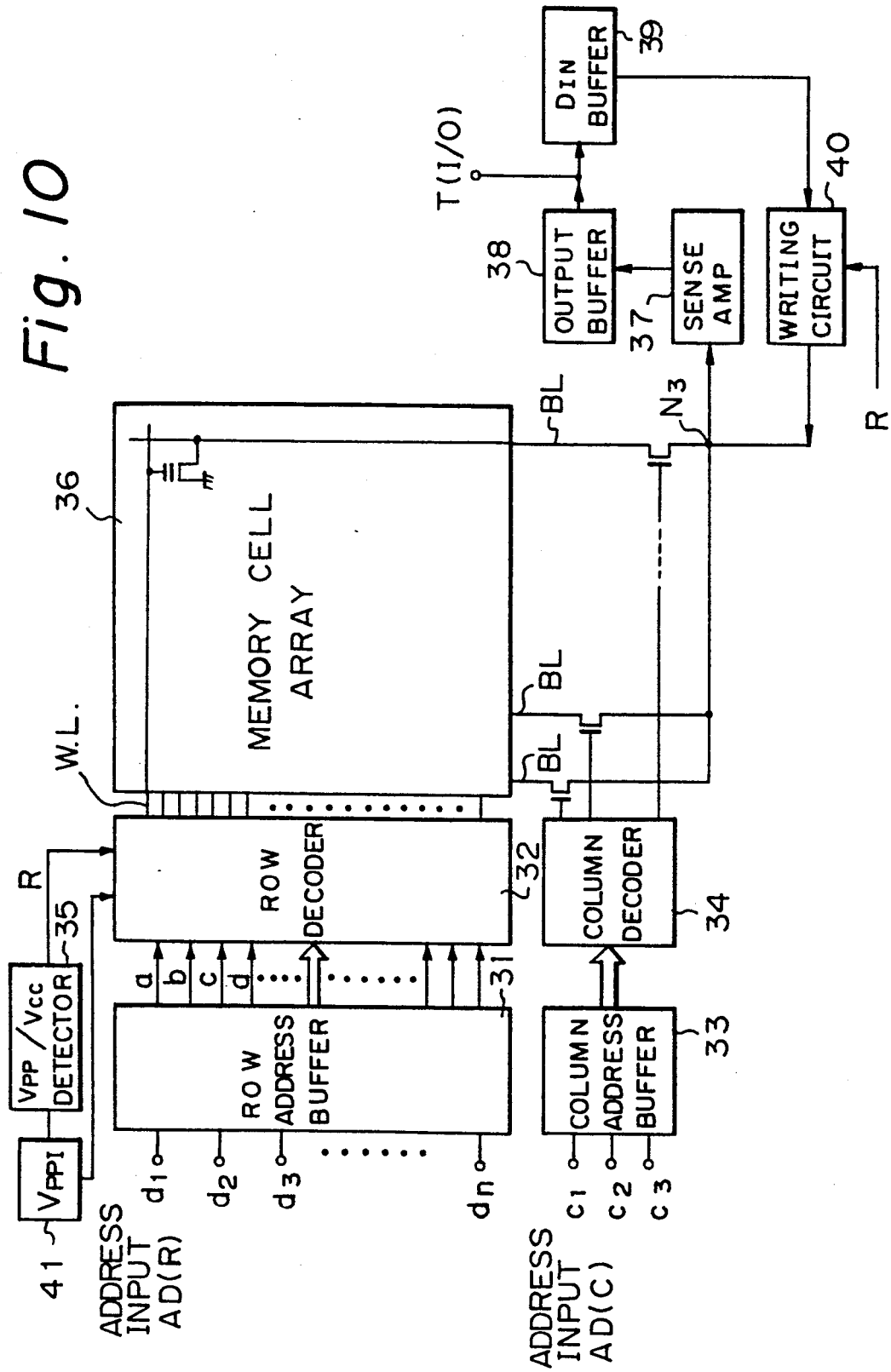
FIG. 10 is a block diagram of an embodiment of a semiconductor memory device of the present invention.

The overall construction of a semiconductor memory device according to an embodiment of the present invention is shown in FIG. 10. In the figure, the semiconductor memory device including a row address buffer 31, a row address decoder 32, a memory cell array 36, a column address buffer 33, a column decoder 34, and a detector, i.e., a decoder source voltage detecting circuit 35.

To an output terminal $N_3$ of the memory cell array 36, a sense amplifier 37, an output buffer 38, a data-in buffer ($D_{IN}$ buffer) 39, an input-output terminal T(I/O), and a writing circuit 40 are connected.

In this device, the address signals for word lines of the memory cell array are input to the terminal $d_1$, $d_2$ . . . $d_n$ of the row address buffer 31 for a waveform shaping operation.

The outputs are applied to the input terminals a, b, c, and d of the row decoder 32, for example.

Figure 1:
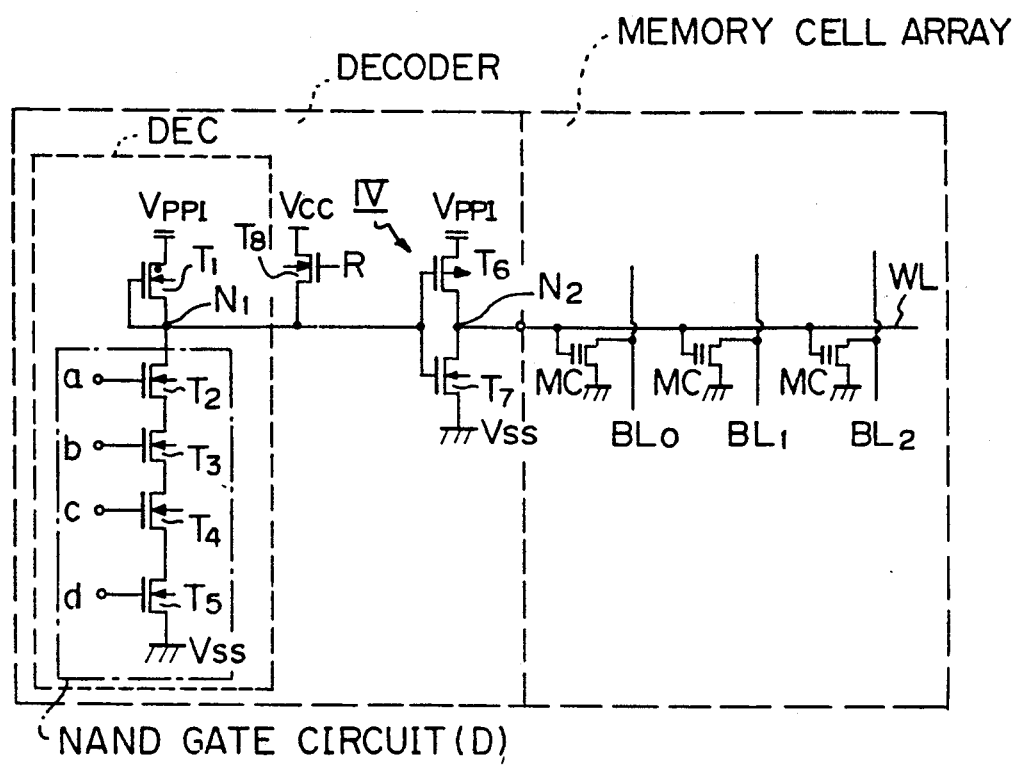
FIG. 1 is a view of one embodiment of the semiconductor memory device of the present invention.
Figure 2:
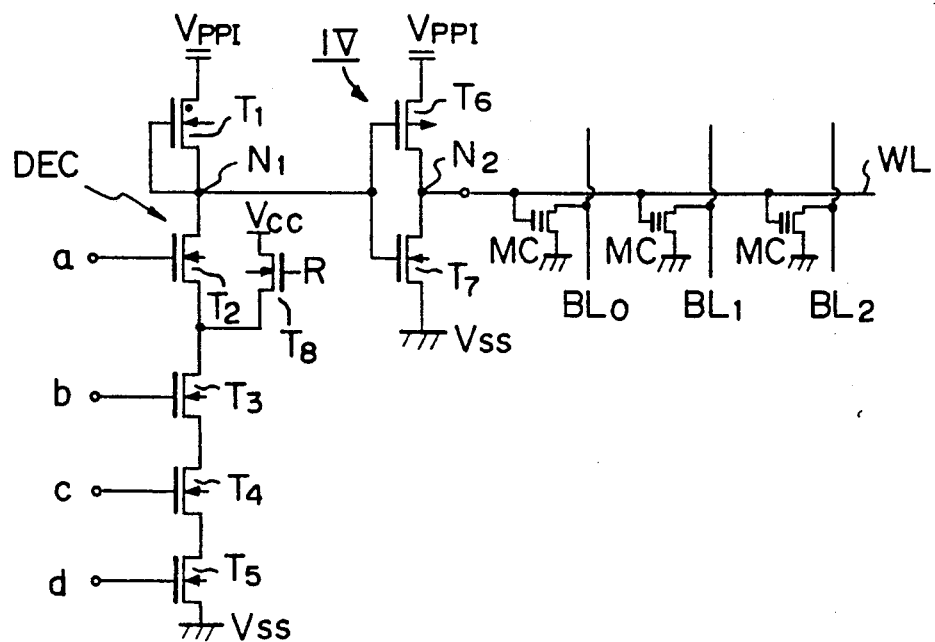
FIG. 2 is a diagram of another embodiment of the semiconductor memory device of the present invention.

The input terminals a to d shown in FIG. 10, correspond to the input terminals a to d of the driving transistors $T_2$ to $T_5$ provided in the decoder circuit (DEC) as shown in FIG. 1 and FIG. 2.

The row address decoder 32 includes a load means $T_1$, a decoder circuit (DEC) including a NAND gate circuit (D) consisting of the driving transistors $T_2$ to $T_5$, serially arranged, an inverter circuit IV, and a means ($T_8$) for increasing the load current (I) at least in the reading mode as shown in FIGS. 1 and 2.

In this embodiment, the load element $T_1$ may be a depletion type transistor having a gate connected to the output node $N_1$. While, the inverter IV is connected between the first power source line and the second power source line, and has an input connected to the output node $N_1$ of the decoder circuit;

The output of the decoder circuit 32 is applied to the word lines WL to select at least one thereof.

Word lines WL are arranged in the memory cell array 36, which consists of a plurality of memory cells MC at crosspoints between the word line WL and the bit lines BL as shown in FIG. 1.

In this embodiment, the semiconductor memory device may be a EPROM, EEPROM, or the like.

The address signals for the bit lines BL of the memory cell array, are input to the terminal $c_1, c_2 \ldots c_n$ of the column address buffer 33.

The outputs are applied to the column decoder 34 in the same manner as explained above.

The output of the decoder circuit 34 is applied to the bit lines $BL_1, BL_2, \ldots BL_n$ to select a certain bit line through a transistor.

The semiconductor memory device is provided with a decoder source voltage $V_{PPI}$ which is a variable voltage source 41 having a switching circuit to switch the decoder source voltage between a high level $V_{PP}$ to a low level $V_{cc}$ in accordance with the reading mode or the writing mode.

The resultant voltage is applied to the decoder source voltage $V_{PPI}$ terminal as shown in FIGS. 1 and 2 in the row decoder 32 and a decoder source voltage detecting circuit, i.e., a $V_{PP}/V_{cc}$ detector 35 to detect whether the decoder source voltage is $V_{PP}$ or $V_{cc}$.

A control signal R for controlling the operation of the load current increasing means ($T_8$) is output and applied to a gate of the load current increasing means ($T_8$) in the row decoder as shown in FIG. 1.

In the reading mode, the signal voltage output from the input and output terminal $N_3$ of the memory cell array 36 is applied to the sense amplifier 37 to read them.

The result is output from the data input-output terminal T(I/O) through an output buffer circuit 38.

In the writing mode, the information to be written is input to the Data-in buffer circuit 39 through the data input-output terminal T(I/O).

The output from the Data-in buffer circuit 39 is input to the input-output terminal $N_3$ of the memory cell array 36 through the writing circuit 40 controlled by the control signal R.

Figure 11:
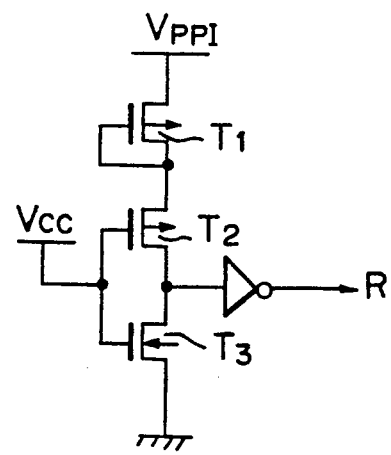
FIG. 11 is a view of an embodiment of the decoder source voltage detector circuit shown in FIG. 10.

In this embodiment, the decoder source voltage detecting circuit 35 may have the circuit as shown in FIG. 11. In that the detector has a circuit, for example, which comprising a first P channel type MOS transistor ($T_1$), a source thereof being connected to said first power source line and a gate thereof being connected to a drain thereof, a second P channel type MOS transistor ($T_2$), a source thereof being connected to a drain of said first transistor ($T_1$), a third N channel type MOS transistor ($T_3$), a drain thereof being connected to a drain of the second transistor ($T_2$), while a source thereof being connected to a second power source line and the circuit further comprising that both gates of the second and third transistors ($T_2$ and $T_3$) being commonly connected to a constant voltage source ($V_{cc}$) while an inverter being connected to a connecting portion formed between the second an third transistors ($T_2$ and $T_3$).

In the writing mode, the variable source voltage $V_{PPI}$ may be a higher voltage $V_{PP}$, for example 12.5 V, referred to as a first power source voltage.

In the reading mode, it may be a lower voltage $V_{cc}$, for example 5 V, referred to as a second power source voltage.

Note that, the first power source voltage is preferably higher than the second power source voltage.

In the decoder source voltage detecting circuit 35, when the voltage $V_{PPI}$ is $V_{PP}$, i.e., 12.5 V, the circuit 35 generates a control signal R having the "L" level, while when the voltage $V_{PPI}$ is $V_{cc}$, i.e., 5 V, the circuit 35 generates a control signal R having the "H" level.

Thus, the load current increasing means ($T_8$) can only be energized when the voltage $V_{PPI}$ is $V_{cc}$, i.e., in the reading mode.

The present invention is characterized in that, in addition to a load means, for example, a load transistor $T_1$ provided in parallel to the NAND gate circuit consisting of the driving transistors $T_2$ to $T_5$, a separate load means, i.e., a load current increasing means $T_8$, is provided to the decoder circuit (DEC), which is energized only in the reading mode in order to increase the threshold level of the NAND gate circuit to improve a noise margin i.e., the resistance to noise.

The load current increasing means $T_8$ is preferably a circuit having a switching function for increasing the load current (I) flowing in the NAND gate circuit in the reading mode over the load current (I) in the writing mode, as explained later.

The construction of the load current increasing means $T_8$ is not particularly limited.

An N-channel enhancement type transistor, an depletion type transistor, a resistor having a switching circuit, or the like may be used. In this embodiment, the load current increasing means comprises an enhancement type transistor connected between the output node $N_1$ and a third power source line supplying the first power source voltage $V_{cc}$.

As explained above, a voltage of $V_{cc}$ is applied to the load current increasing means $T_8$ to energize the switching function of the load current increasing means $T_8$ in the reading mode.

The load resistance of the NAND gate circuit is reduced and the threshold voltage level of the NAND gate circuit is increased in the reading mode.

In the writing mode, a voltage $V_{ss}$, i.e., 0 V is applied to the gate of the load current increasing means $T_8$ to deenergize and place it in a nonconductive condition in the writing mode.

The load of the NAND gate circuit only consists of the load means $T_1$, so the NAND gate circuit can operate in the same manner as an usual condition.

The load current increasing means $T_8$ may be provided in the decoder circuit at a node portion $N_1$ at which the load means $T_1$ and the NAND gate circuit are connected in parallel as shown in FIG. 1.

The load current increasing means ($T_8$) may be provided at any connecting portion between two adjacent series-connected driving transistors in the NAND gate circuit.

Accordingly, it may be provided at the connecting portion between a transistor $T_2$ and a transistor $T_3$, between a transistor $T_3$ and a transistor $T_4$, and so on, for example as shown in FIG. 2.

FIG. 2 shows an embodiment in which the load current increasing means $T_8$ is provided at the connecting portion between the transistor $T_2$ and the transistor $T_3$ as one example of the present invention.

As explained above, the value of the load resistance in the decoder circuit (DEC) is reduced only in the reading mode by energizing the load current increasing means $T_8$, that is, the load current is increased in the reading mode.

Figure 4:
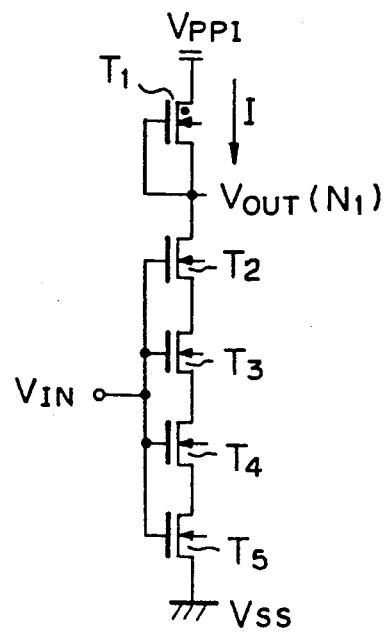
FIG. 4($a$) is a view of a decoder circuit of the conventional semiconductor memory device wherein the driving transistors have a common input voltage.
Figure 4:
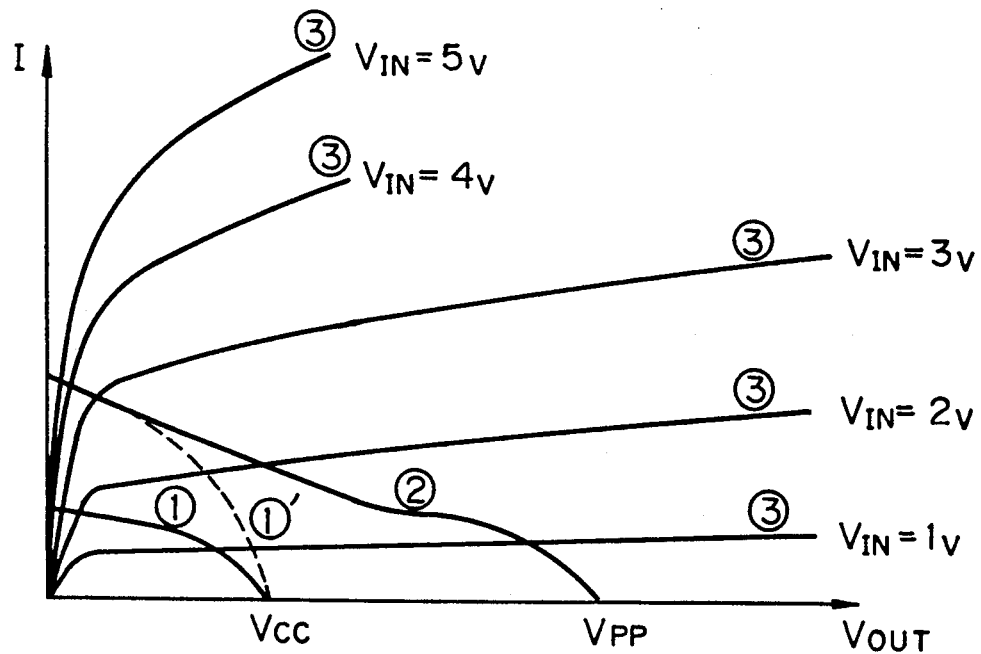
Figure 7:
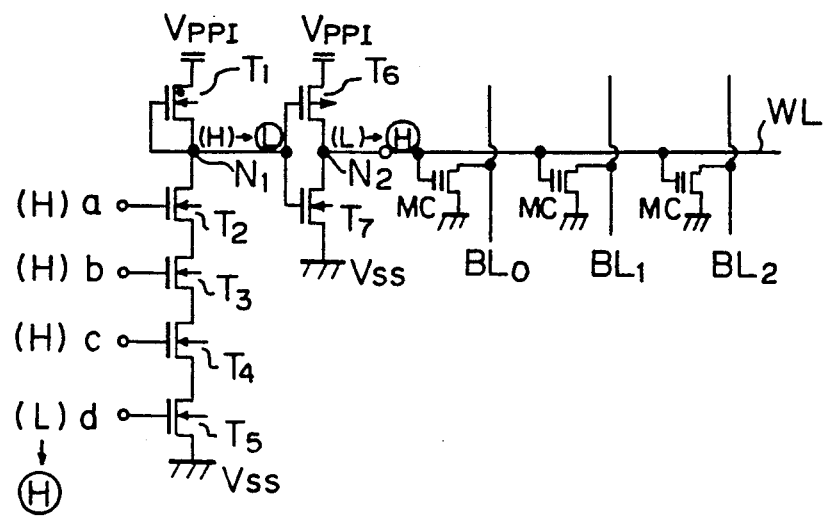
FIG. 7 is a block diagram of a decoder of a conventional semiconductor memory device showing one situation thereof as an example.
Figure 8:
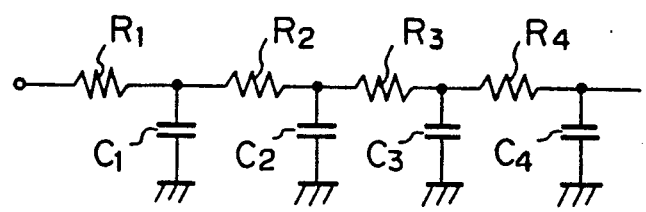
FIG. 8 is an equivalent circuit of one of the word lines in a memory cell array.
Figure 9:
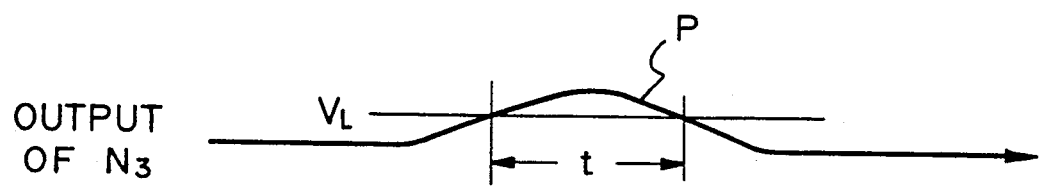
FIG. 9 is chart illustrating the conditions when a sense amplifier reads erroneous data on a signal taken out from a memory cell.

Accordingly, the load curve of the load transistor $T_1$ in the reading mode is varied from the load curve to the load curve ' as shown in FIG. 4(b).

Therefore, the load curve of the load transistor $T_1$ in the reading mode can instantly take a configuration close to the load curve in the writing mode, so that the load transistor $T_1$ can perform the same in both the reading and the writing mode instantly.

As apparent from in FIG. 4(c), the original input-output characteristic curve of the decoder circuit in the reading mode can be altered to the input-output characteristic curve instantly.

Therefore, the noise immunity of the decoder circuit can be improved by increasing the threshold voltage level in the reading mode.

Moreover, the threshold voltage level can be set at $V_{cc}/2$ in the reading mode by selecting a suitable mutual conductance (gm) of the transistor $T_8$ as the load current increasing means.

In the writing mode, since the load current increasing means $T_8$ is in a deenergized condition, the means $T_1$.

FIG. 1 shows a first embodiment of the semiconductor memory device of the present invention.

Figure 3:
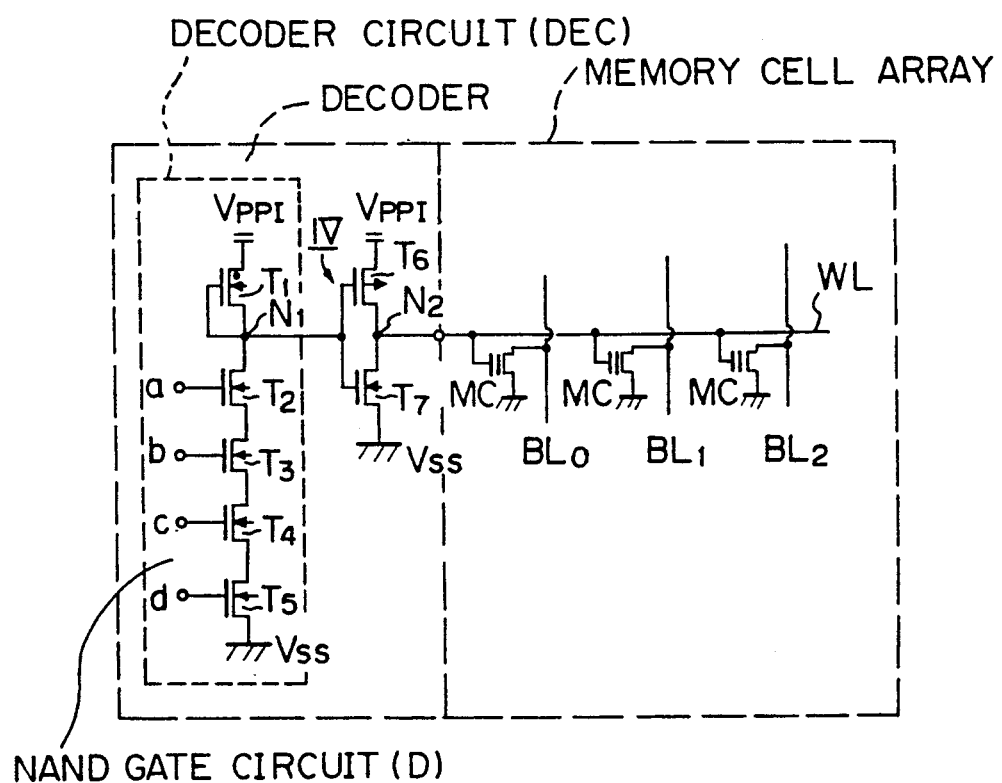
FIG. 3 is a view of one example of a conventional semiconductor memory device.

In FIG. 1, the same elements as in FIG. 3 carry the same symbols.

$T_1$ is an N channel depletion type MOS transistor, $T_2$ to $T_5$ and $T_7$ are N-channel enhancement type MOS transistors and $T_6$ is a P channel enhancement type MOS transistor.

An N channel enhancement type transistor $T_8$ is connected as the load current increasing means to a node portion $N_1$ between the decoder voltage source $V_{cc}$ and the NAND gate circuit of the decoder circuit (DEC) and arranged parallelly to the load means $T_1$.

As explained above, the decoder circuit is constructed so as to switch the decoder source voltage $V_{PPI}$ internally to a high first decoder source voltage $V_{PP}$, for example 12.5 V, and to a low second voltage $V_{cc}$, for example, 5 V, in the reading mode.

This switching operation can be performed utilizing a known switching circuit.

In one embodiment of the present invention, a controlling circuit 35 as shown in FIG. 10 having the circuitry shown in FIG. 11 is used as the switching means.

As explained above, the control signal R input to the gate of the transistor $T_8$, i.e., a load current increasing means, turns to $V_{cc}$, i.e., the "H" level, in the reading mode and to $V_{ss}$, i.e., the "L" level, in the writing mode.

Accordingly, in the reading mode, the control signal R is "H", so the transistor $T_8$ is turned ON.

Therefore, the load transistor $T_1$ and the load current increasing transistor $T_8$ are connected in parallel to the series of the driving transistors $T_2$ to $T_5$ of the NAND gate circuit in the decoder circuit DEC.

In this situation, the threshold voltage level of the NAND gate circuit in the reading mode can be increased and set at around $V_{cc}/2$ by suitable selecting the performance of the transistor $T_8$, for example, the mutual conductance (gm).

In the writing mode, the level of the control signal R is $V_{ss}$, i.e., 0 V, so the transistor $T_8$ is turned OFF.

Accordingly, the NAND gate circuit can operate in the normal and conventional manner with only the load transistor $T_1$.

FIG. 2, shows another embodiment of the semiconductor memory device of the present invention.

In FIG. 2, the source of the transistor $T_8$, i.e., the load current increasing means, is connected to the connecting portion between the transistors $T_2$ and $T_3$ in the NAND gate circuit consisted of the transistors $T_2$ to $T_5$.

In this embodiment, the construction and the operation of the transistor $T_8$ is the same as that of the first embodiment.

The load to the transistor $T_2$ does not vary, but the load resistance of the transistors $T_3$ to $T_5$ can be reduced in the reading mode in the same manner as in the first embodiment, so the threshold level of the NAND gate circuit in the reading mode can be increased.

Generally, in a NAND gate circuit, the further a transistor is arranged from the load transistor $T_1$ in series, the weaker it is to noise.

For example, the transistors $T_4$ and $T_5$ are weaker when to compared with the transistor $T_2$ or $T_3$.

In this embodiment, the input characteristic of those transistors $T_3$, $T_4$, and $T_5$ are improved.

Therefore, even if the performance of the transistor $T_2$ is not improved, the improvement of the input characteristic of those transistors $T_3$, $T_4$, and $T_5$, remarkably improves the threshold voltage level in the reading mode, from the point of view of the decoder circuit as a whole and the object of this invention can be fully realized.

In the embodiments shown in FIGS. 1 and 2, in the reading mode, a control signal R having a voltage level $V_{cc}$ is applied to the gate of the transistor $T_8$ and the load resistance of the NAND gate circuit is reduced in the reading mode (in another words, the load current I is increased) to increase the threshold voltage level to $V_{cc}/2$.

As another embodiment of the present invention, the following method can be used, in which the gate voltage of the transistor $T_1$ is controlled so that the ON resistance of the transistor $T_1$ in the reading mode is reduced to less than the ON resistance in the writing mode, instead of utilizing the transistor $T_8$.

The source voltage $V_{PPI}$ of the load means $T_1$ may be commonly used for the source $V_{cc}$ of the load current increasing means $T_8$ because the means $T_8$ only works when the source voltage $V_{PPI}$ is set at $V_{cc}$, i.e., 5 V.

The decoder circuit was explained as used for a row decoder circuit, but it can also be used for a column decoder circuit.

Further, another embodiment of the present invention comprises a first power source line for supplying a first power source voltage during a reading mode and a second power source voltage, which is higher than the first power source voltage, during a writing mode, a second power source line for supplying a third power source voltage which is lower than the first power source voltage and a decoder decoding an address information. The decoder includes a plurality of transistors, connected between an output node and the second power source line, controlled by address information, and load means, connected between the first power source line and the output node, for supply a load current. A current supplying ability of the load means is varied so that the current supplying ability of the reading mode is higher than the current supplying ability of the writing mode.

In this embodiment, the load means $T_1$ and load current increasing means $T_8$ are combined and represented as one load means.

As stated above, in the semiconductor memory device of the present invention, erroneous operations of the decoder caused by noise can be effectively prevented because the threshold voltage level of the decoder circuit is increased up to about $V_{cc}/2$ in the reading mode, contributing to improvement of the reliability of the memory device.

Even when noise is added to the address input signal, since the decoder circuit of the present invention has a sufficient noise immunity, the decoder does not easily operate erroneously by noise, so erroneous operations in the memory cell array caused by noise can also effectively be prevented.

I claim:

1. A semiconductor memory device comprising:
   a first power source line for supplying a first power source voltage during a reading mode and a second power source voltage, which is higher than the first power source voltage, during a writing mode;
   a second power source line for supplying a third power source voltage which is lower than the first power source voltage;
   a decoder circuit including a load element connected between the first power source line and an output node, said decoder circuit having a first load current flowing therethrough when said semiconductor memory device is in said writing mode;
   a plurality of transistors, connected in series between the output node and the second power source line, for decoding address information; and
   load current increasing means, connected to said decoder circuit, for increasing the load current, flowing through said decoder circuit, over said first load current during reading mode.

2. A semiconductor memory device according to claim 1, wherein said load current increasing means is provided at the output node of said decoder circuit.

3. A semiconductor memory device according to claim 1, wherein said load current increasing means is provided at any connecting portion between two adjacent transistors in said decoder circuit.

4. A semiconductor memory device according to claim 1, wherein the load element is a depletion type transistor having a gate connected to the output node.

5. A semiconductor memory device according to claim 2, wherein said load current increasing means comprises an enhancement type transistor connected between the output node and a third power source line supplying the first power source voltage, the enhancement type transistor being turned on during the reading mode.

6. A semiconductor memory device according to claim 3, wherein said load current increasing means comprises an enhancement type transistor connected between the connecting portion and a third power source line supplying the first power source voltage, the enhancement type transistor being turned on during the reading mode.

7. A semiconductor memory device according to claim 1, wherein said device further comprising;
   an inverter, connected between the first power source line and the second power source line, having an input connected to the output node of the decoder circuit;
   a word line connected to an output of the inverter; and
   memory cells connected to said word line.

8. A semiconductor memory device according to claim 1, wherein said device further comprising a detector, connected to said first power source line, for generating a control signal when the first power source voltage is detected on the first power source line, and said load current increasing means being activated by the control signal.

9. A semiconductor memory device according to claim 8, wherein said detector has a circuit comprising;
   a series of transistors in which a first transistor having a first type, a second transistor having a first type and a third transistor having a second type different from the first type are serially arranged to each other, and an end of the first transistor being connected to said first power source line, while an end of the third transistor being connected to said second power source line, and both gates or bases of said second and third transistors being commonly connected to a constant voltage source, and a gate or base of said first transistor being connected to a connecting portion formed between said first and second transistor, while an inverter being connected to a connecting portion formed between said second and third transistors.

10. A semiconductor memory device comprising:
    a first power source line for supplying a first power source voltage during a reading mode and a second power source voltage, which is higher than the first power source voltage, during a writing mode;
    a second power source line for supplying a third power source voltage which is lower than the first power source voltage; and
    an address decoder decoding address information, said decoder including a plurality of decode transistors, connected in series between a decode output node and said second power source line, controlled by the address information; and
    load means, connected between said first power source line and said decode output node, for supplying a first load current to the decoder transistors during a reading mode and a second load current to the decode transistors during a writing mode, the first load current being larger than the second load current.

11. A semiconductor memory device comprising:
    a first power source line for supplying a first power source voltage during a reading mode and a second power source voltage, which is higher than the first power source voltage, during a writing mode;
    a second power source line for supplying a third power source voltage which is lower than the first power source voltage;
    a decoder, connected between said first power source line and said second power source line, for decoding address information and being controlled by a control signal, said decoder having a first load current flowing therethrough when said semiconductor memory device is in said writing mode; and
    a detector connected to said decoder and said first power source line, generating said control signal when the first power source voltage is detected on the first power source line, wherein a current flowing through said decoder is increased over said first load current during the reading mode in response to said control signal.

12. A semiconductor memory device comprising:
a first power source line for supplying a first power source voltage during a reading mode and a second power source voltage, which is higher than the first power source voltage, during a writing mode;
a second power source line for supplying a third power source voltage which is lower than the first power source voltage; and
a decoder for decoding address information, said decoder including a plurality of transistors, connected between an output node and the second power source line, being controlled by the address information; and
load means, connected between said first power source line and the output node, for supplying a variable load current to said decoder, the load means being varied so that the load current flowing through said decoder in the reading mode is higher than the load current flowing through said decoder in the writing mode.

* * * * *